United States Patent
Grillo

(10) Patent No.: US 7,102,434 B2
(45) Date of Patent: Sep. 5, 2006

(54) VARIABLE GAIN LOW-PASS FILTER

(75) Inventor: Lionel Grillo, Meylan (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/649,998

(22) Filed: Aug. 26, 2003

(65) Prior Publication Data

US 2004/0041630 A1    Mar. 4, 2004

(30) Foreign Application Priority Data

Aug. 30, 2002   (FR) .................................. 02 10751

(51) Int. Cl.
*H03F 3/45*    (2006.01)

(52) U.S. Cl. .................... 330/254; 330/257; 330/261

(58) Field of Classification Search ........ 330/253–261, 330/278, 330
See application file for complete search history.

(56) References Cited

U.S. PATENT DOCUMENTS 5,594,383 A *   1/1997   Tamba ......................... 330/253
6,563,382 B1 *   5/2003   Yang ........................... 330/254

OTHER PUBLICATIONS

P.R. Gray et al. "Analysis and Design of Analog Integrated Circuits", Mar. 2001, New York, Chapter 4, pp. 287-293 and Chapter 12, pp. 808-832, XP002241157.

Menolfi C. et al. "A Low-Noise CMOS Instrumentation Amplifier for Thermoelectric Infrared Detectors", IEEE Journal of Solid-State Circuits, IEEE, Inc. New York, vol. 32, No. , Jul. 1997, pp. 968-976, XP000729356.

Gopinathan V. et al. "Design Considerations and Implementation of a Programmable High-Frequency Continuous-Time Filter and Variable-Gain Amplifier in Submicrometer CMOS", IEEE Journal of Solid State circuits, IEEE Inc., New York, vol. 34, No. 12, Dec. 1999, pp. 1698-1707, XP000932500.

Daubert S. J. et al. "A Transistor-Only Current-Mode Sigma Delta Modulator", IEEE Journal of Solid State Circuits, IEEE Inc., New York, vol. 27, No. 5, May 1992, pp. 821-830, XP000291092.

French Preliminary Search Report dated May 14, 2003 for French Application No. 0210751.

* cited by examiner

*Primary Examiner*—Khanh Van Nguyen
(74) *Attorney, Agent, or Firm*—Lisa K. Jorgenson; Jon A. Gibbons; Fleit, Kain, Gibbons, Gutman, Bongini & Bianco P.L.

(57) ABSTRACT

A low-pass filter with a variable gain comprising a transconductance differential amplifier stage comprising a differential input and a differential output, the latter receiving a passive circuit, such as a first-order RC filter, in order to realize low-pass filtering of the amplifier stage. The filter is chosen so that the cut-off frequency is below the frequency range to be treated. The filter further comprises a control element controlling the differential amplifier stage's bias point to allow control of the gain associated to filtering. Thus, low-pass filtering associated to a variable gain can be realized in a very simple way. The circuit is perfectly adapted for incorporation into a semiconductor product.

19 Claims, 4 Drawing Sheets

VARIABLE GAIN LOW-PASS FILTER

CROSS REFERENCE TO RELATED APPLICATIONS

This application is based upon and claims priority from prior French Patent Application No. 0210751, filed Aug. 30, 2002, the disclosure of which is hereby incorporated by reference in its entirety.

BACKGROUND OF THE INVENTION

1. Field of the Invention

The present invention relates to electronic circuits, and more particularly to a low-pass filtering circuit with a variable gain.

2. Description of Related Art

In a number of electronic devices, it is useful to be able to combine a low-pass filter with a variable gain stage, which must provide adequate precision to the gain to be obtained. In general, such a circuit is realized by a series of discrete elements, namely a first filtering element having a fixed gain, followed by one or more amplifier stages, one of which has a variable gain. To realize a variable gain, one frequently uses closed loop amplifier circuits whose back gain is set by discrete values through digital control or variable amplifiers using scale interpolators. A complex combination of components including a series of amplifiers, power sources and more must be provided for all of these circuits.

Such complexity then results in a need for space on the semiconductor product, in an increased power consumption and finally in significantly high implementation costs.

Accordingly, a need exists to overcome the complexity of the prior art and to provide a circuit which is easily to fabricate allowing realization of a low-pass filtering function associated with variable gain.

SUMMARY OF THE INVENTION

The present invention reduces the complexity of the prior art devices by providing a low-pass filter circuit with variable gain that is particularly easy to implement, inexpensive and easy to incorporate into a semiconductor product.

The present invention includes a low-pass filter based on a transconductance differential amplifier stage comprising a differential input and a differential output. The amplifier is assembled as an open loop with a passive system connected to its output in order to realize low-pass filtering. The cut-off frequency of the amplifier stage is chosen so that it is below the frequency range to be treated. Then an amplifier stage bias point control element is added to allow control of the gain associated with the filtering effect.

Thus, low-pass filtering associated with a variable gain is realized with reduced complexity as complexity with prior art device and that is very easy to incorporate into a semiconductor product. Moreover, as the amplifier stage operates in open loop, extremely high frequencies are realized.

Preferably, the filter comprises a differential stage constituted of a first transistor and a second transistor whose gates receive the signal to be treated. A third transistor and a fourth transistor constitutes active charges for the first and second transistors, which are controlled by the control element. A fifth transistor comprises a power source that is controlled in turn by the gain control element. Accordingly, a filtering and gain assembly is built in a minimum space.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings.

DETAILED DESCRIPTION OF AN EMBODIMENT

Figure 1:
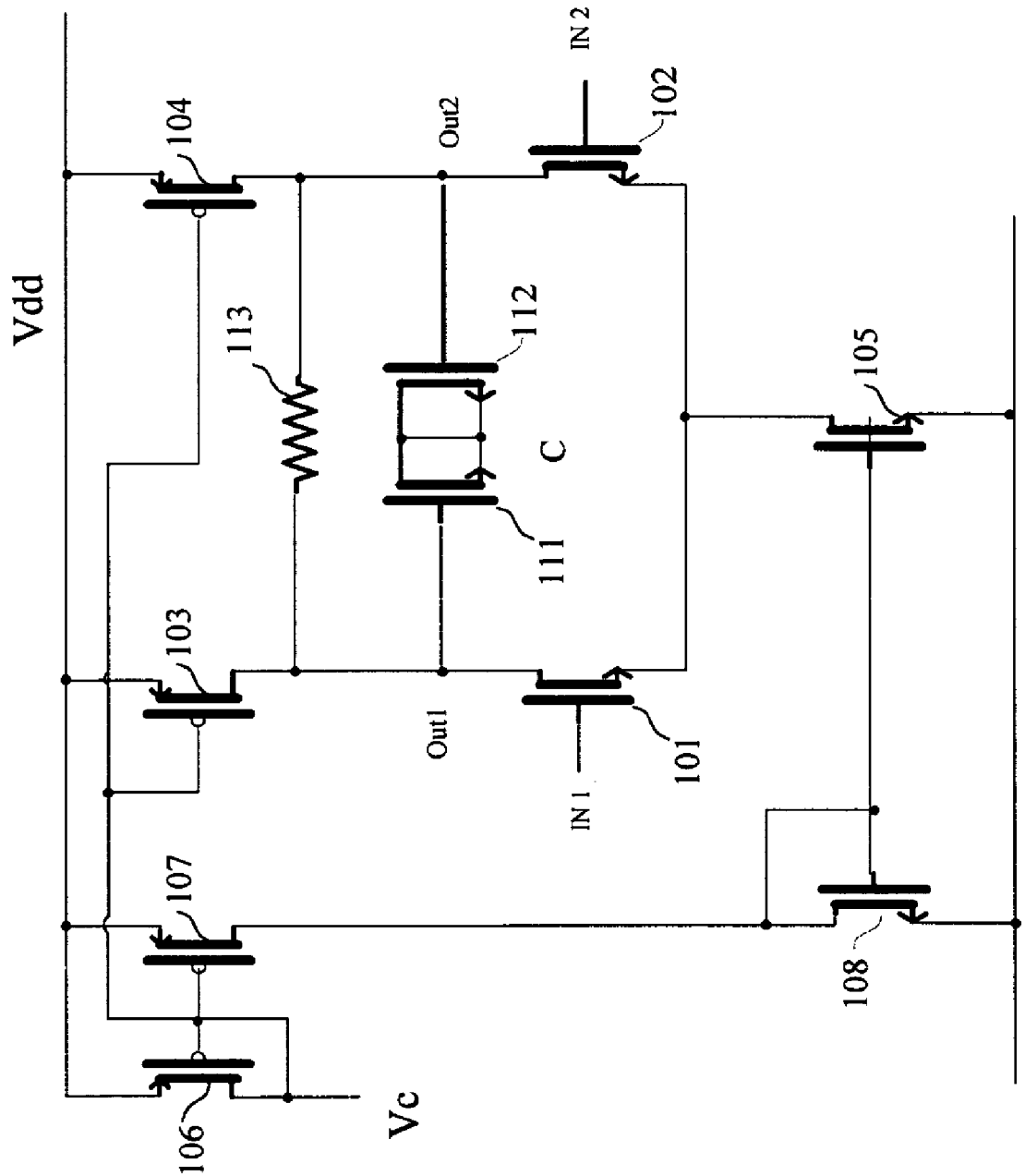
FIG. 1 is a schematic of an embodiment of the variable gain low-pass filter, according to the present invention.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality. In the drawing like numerals refer to like parts through several views.

FIG. 1 is a schematic of an embodiment of the variable gain low-pass filter, according to the present invention. This circuit in FIG. 1 is particularly adapted to carry out filtering before a sinusoidal signal generator, and could be directly incorporated into a semiconductor product.

A filter having a differential structure and realized by one or more MOS-type transistors is now described. Obviously, people of average skill in the art are able to readily adapt the description in order to use other types of transistors and carry out minor adaptations to realize an exactly similar structure, within the true scope and spirit of the present invention.

The filtering circuit is based on a differential pair made up of NMOS-type transistors 101 and 102 whose gates constitute inputs IN1 and IN2 and receive the differential signal to be filtered. The source of each of NMOS-type transistors 101 and 102 is connected to the drain of an NMOS-type transistor 105, which is used as power source for the differential pair. Transistor 105 has a source electrode connected to a first reference voltage, such as, ground. The drain of transistor 101 (respectively 102) is connected to the drain of a PMOS-type transistor 103 (respectively 104) whose source is connected to supply voltage $V_{dd}$. The drain of transistor 103 (respectively 104) is connected to a first output OUT$_1$ (respectively second output OUT$_2$). The gates of transistors 103 and 104 are connected to the gate of a PMOS-type transistor 107 that has a source connected to a second reference voltage, such as supply voltage $V_{dd}$. Transistor 107 has a drain connected to the drain and the gate of an NMOS-type transistor 108, and to the gate of transistor 105 that is the power source for the differential pair 101 and 102. The source of transistor 108 is connected to the ground level of the circuit.

The bias point of the differential pair is set by a control voltage $V_c$ that is presented to the drain of a PMOS-type transistor 106, whose source is connected to supply voltage $V_{dd}$. The gate of transistor 106 is connected to the gate of transistors 107, 103 and 104, and to voltage $V_c$.

A resistor 113 is connected between both outputs of the differential pair 101-102 in order to cause the open loop gain of this differential structure to drop. A capacitor is further connected between both outputs $OUT_1$ and $OUT_2$ of the differential pair in order to produce a R-C filter. Preferably, this capacitor will be produced through an assembly of two MOS-type transistors whose gate, source and drain are connected together. Thus, transistors' gate/drain capacity is used to produce capacitor C. The value of the R-C filter is selected so that the cut-off frequency of the amplifier is below the frequency range to be treated. Thus, contrary to the conventional approach that consists in looping the amplifier, differential structure 101-102 operates in open loop.

The operation of the transconductance amplifier is as follows. Voltage $V_c$ controls the current flowing in the drain of transistor 106, and consequently in transistor 107. When control voltage $V_c$ increases, transistor 107 becomes less conducting. The current that flows through transistor 107 is mirrored, with different coefficients that depend on the transistors' particular geometry in current mirroring transistors 103 and 104 on one hand and, on the other hand, in transistors 107–108 that control power source 105. Thus, control voltage $V_c$ provides a very effective element for controlling the bias point of the transconductance amplifier and setting its gm parameter. Accordingly, a direct access to the gain of the stage is possible. As the cut-off frequency of the assembly is set sufficiently low compared to the frequency range under consideration, it is clear that relative values of the attenuations between the various harmonics of the signal to be filtered are not modified. Consequently, the described circuit has the two distinct following functions:

First, the circuit produces a low-pass filter that, in the chosen example of a first-order R-C network, provides for a 20 dB attenuation per decade compared to the fundamental component of the considered signal.

Thee second, the circuit makes it possible to precisely control gain, by a control element $V_c$ that sets parameter gm of the differential pair 101-102.

Thus, filtering associated with a variable gain is realized, by a single amplifier stage. Obviously, people of average skill in the art are able to readily adapt the filter's structure and, for example, choose more sophisticated R-C filters, in particular second-order filters, third-order filters and more, within the true scope and spirit of the present invention.

In one embodiment, the cut-off frequency of the filtering circuit is well below the considered frequency range to allow the desired variable gain effect. In another embodiment, the cut-off frequency is just below the considered frequency range.

Figure 4:
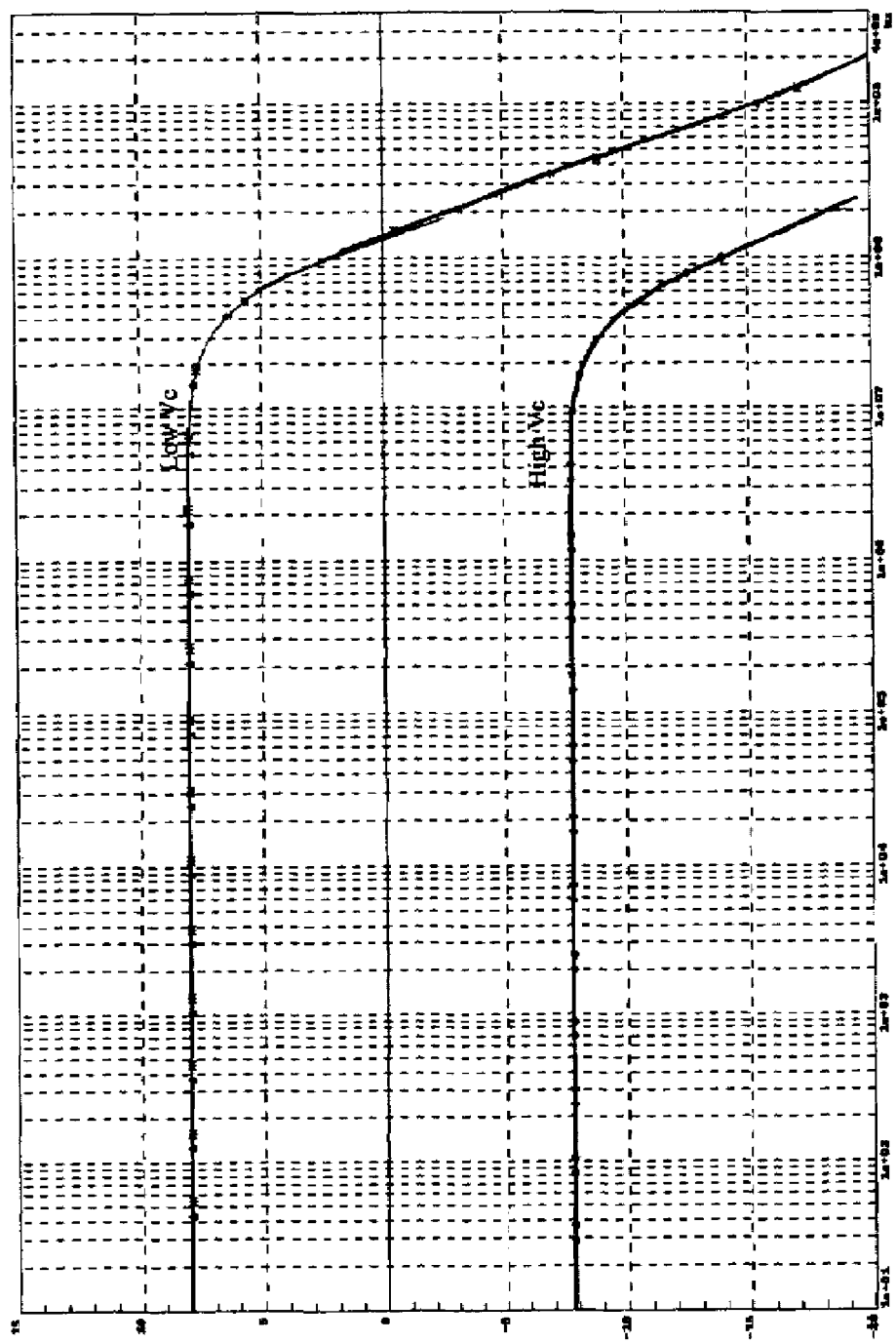
FIG. 4 is a plot of a response curve of a variable gain filter, according to the present invention.

FIG. 4 is a plot of the frequency response of the variable gain filter 201 for two different values different of control voltage $V_c$, according to the present invention.

Figure 2:
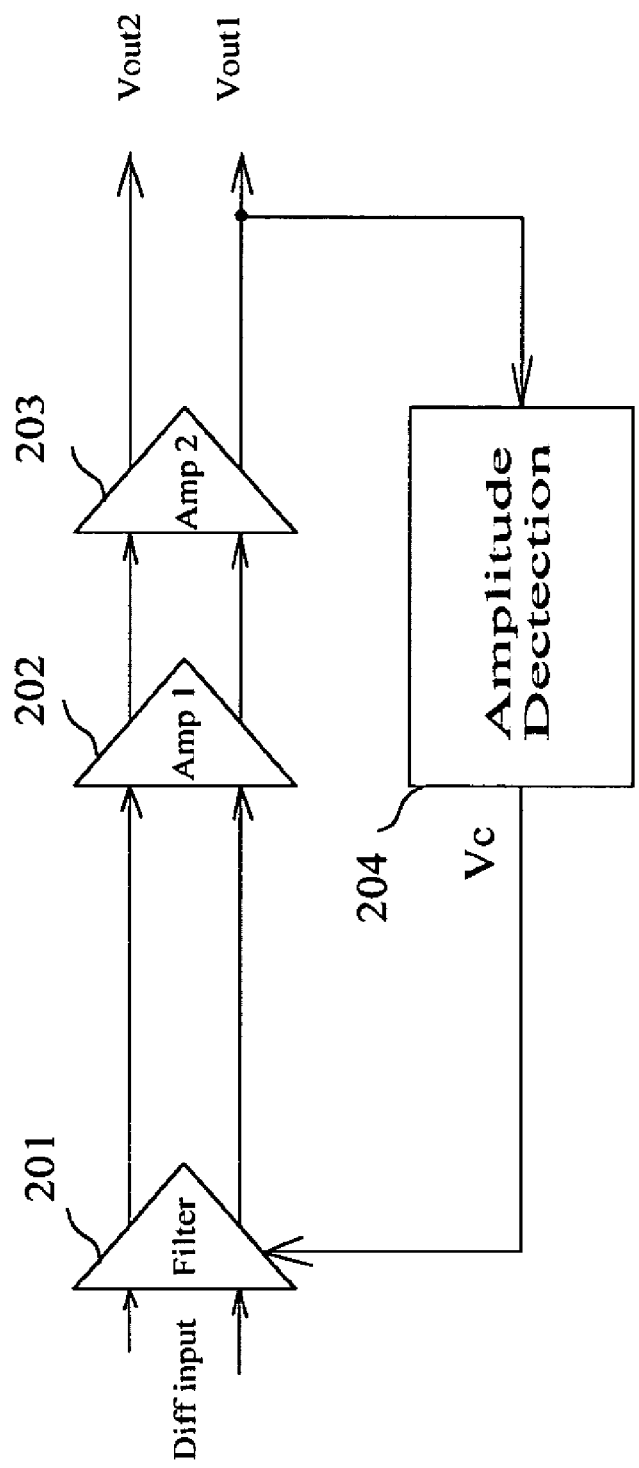
FIG. 2 is a block diagram illustrating a typical application of the circuit of FIG. 1, in a filter with amplitude control, according to the present invention.

FIG. 2 is a block diagram illustrating a typical application of the circuit of FIG. 1, in a filter with amplitude control, according to the present invention. To this end, a filter 201—having a structure as shown in FIG. 1—receives the differential signal to be treated and generates an output signal that, optionally, is transmitted to a first fixed gain amplifier 201, and even to a second amplifier 202. At the output, both differential components ($V_{out1}$, $V_{out2}$) of the filtered analogical signal and one of the components (for example $V_{out1}$) is then injected into an amplitude detection circuit 204 generating the control voltage $V_c$ that is used to control the bias point of the filter's (201) transistors.

Figure 3:
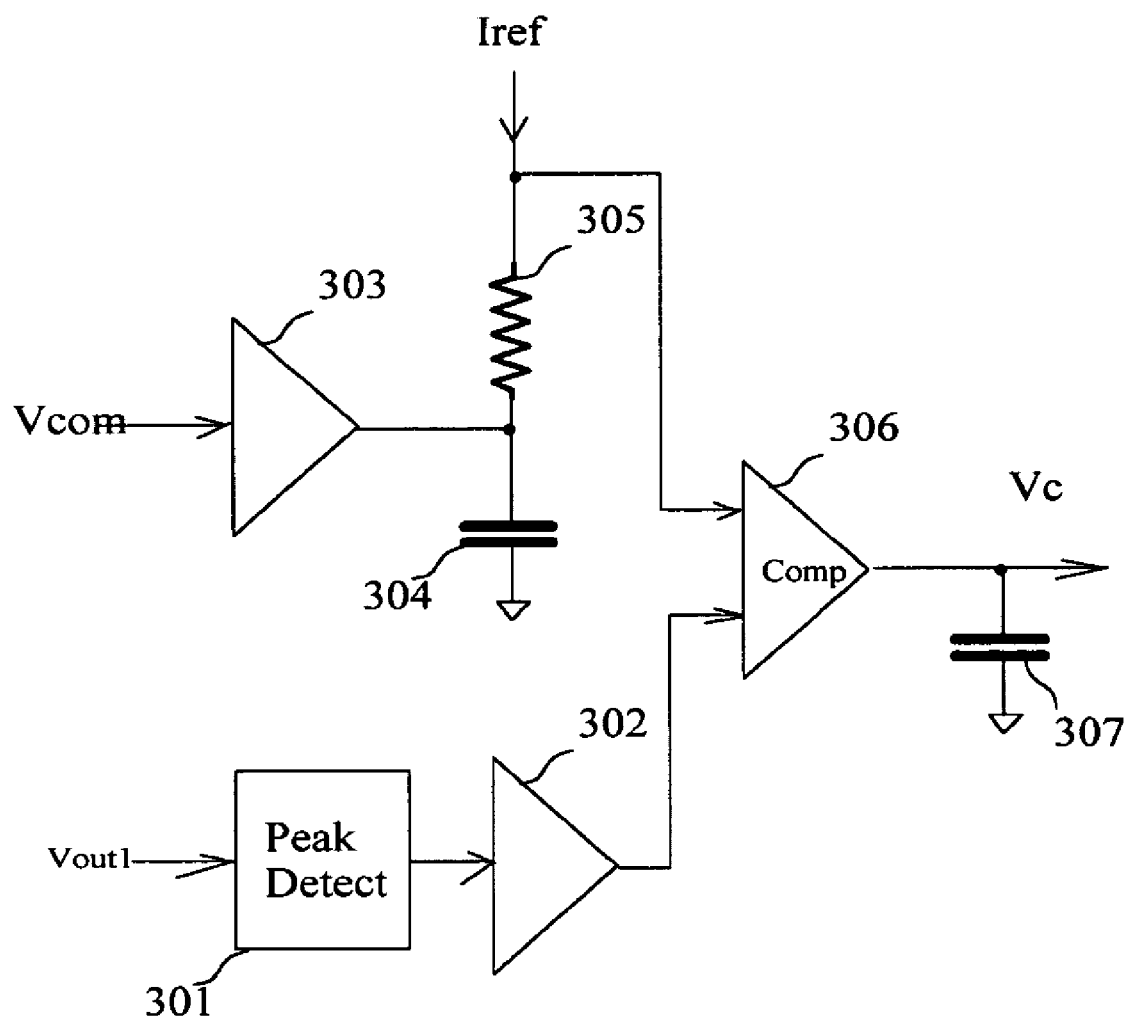
FIG. 3 illustrates a way to implement the amplitude detection element of FIG. 2, according to the present invention.

FIG. 3 illustrates a way to implement the amplitude detection element 204 of FIG. 2, according to the present invention. A peak detect 301 is used to sample the maximum value of signal Vout. Such a detect circuit is well known to people of the art. The sampled value is then transmitted via a cascade circuit 302 to a first input of a comparator 306.

Voltage $V_{com}$, which is the common mode voltage of Vout2, is fed into a voltage cascade circuit 303 that has an output connected to the middle point of a R-C circuit (305, 304) receiving a reference current $I_{ref}$. The input that receives current $I_{ref}$ is also connected to a second input of comparator 306. That amounts to adding a voltage $R \times I_{ref}$ to $V_{com}$ and the result of this addition is then compared to the peak value of signal Vout1. The result of the comparison makes it possible to charge a capacitor 307 that supplies control voltage $V_c$.

As shown in the figure, as long as the peak value that is sampled is different from the reference value, comparator 306 modifies capacitor's 307 charge in order to adequately modify the bias of stage 101-102 of filter 201, and consequently the gain.

Thus, filtering associated with amplitude control is realized, and with a minimum number of components. Moreover, as the differential pair operates in open loop, it is observed that the circuit is advantageously used with a very large range of frequencies, even with very high frequencies.

The above-described circuit of the invention is perfectly adapted to the realization of a frequency reception tuner operating in a broad frequency range, and is easily incorporated into a semiconductor product.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A low-pass differential filter with a variable gain, comprising:
   a transconductance differential amplifier stage mounted in an open loop including:
      a first differential input and a second differential input, and
      a first differential output and a second differential output,
      with the first differential input and the second differential input having a given frequency range;
   a passive circuit, including a capacitive element in parallel with a resistor, connected between the first differential output and the second differential output, the passive circuit for providing low-pass filtering of the differential amplifier stage whose cut-off frequency is below the frequency range to be amplified; and
   a control element for controlling a bias point of the differential amplifier stage so as to regulate a gain thereof.

2. The low-pass filter according to claim 1, wherein the differential amplifier stage further comprises:
   a first transistor with a source, a gate, and a drain, wherein the gate of the first transistor receives a first portion of the differential input to be filtered;
   a second transistor with a source, a gate, and a drain, wherein the gate of the second transistor receives a second portion of the differential input to be filtered;

a third transistor and a fourth transistor each with a source, a drain and a gate configured for setting the bias point of differential amplifier stage;

a fifth transistor with a source, a drain and a gate, and constituting a power source for the first transistor and the second transistor; and wherein a bias current of the third transistor, the fourth transistor and the fifth transistor are controlled by the control element.

3. The low-pass filter according to claim 2, wherein the passive circuit for providing the low-pass filtering is a first-order filter realized by at least the capacitive element and a drain-source resistance of one or more of the first transistor, the second transistor, the third transistor, and the fourth transistor.

4. The low-pass filter according to claim 3, wherein the capacitive element is one or more MOS-type transistor.

5. The low-pass filter according to claim 2, wherein the source of the first transistor and the source of the second transistor are connected to the drain of the fifth transistor;

wherein the source of the fifth transistor is connected to a first reference voltage;

wherein the drain of the first transistor is connected to the drain of the third transistor and the source of the third transistor is connected to a second reference voltage;

wherein the drain of the second transistor is connected to the drain of the fourth transistor and the source of the fourth transistor is connected to the second reference voltage; and wherein the gate of the third transistor, the fourth transistor, and the fifth transistor are controlled by the control element.

6. The tow-pass filter according to claim 5, wherein the control element comprises:

a sixth transistor with a source, a drain and a gate, the source of the sixth transistor connected to the second reference voltage, and the drain of the sixth transistor receiving a control voltage;

a seventh transistor with a source, a drain and a gate, the source of the seventh transistor connected to the second reference voltage, and the gate of the seventh transistor being connected to the gate of the sixth transistor, the third transistor, and the fourth transistor, and to the control voltage;

a eighth transistor with a source, a drain and a gate, the source of the eighth transistor connected to the first reference voltage, and the drain and the gate of the eighth transistor both connected to the drain of the seventh transistor and to the gate of the fifth transistor.

7. The low-pass filter according to claim 1, wherein the first transistor, the second transistor, and the fifth transistor are NMOS-type and wherein the third transistor and the fourth transistor are PMOS-type.

8. The low-pass filter according to claim 2, wherein the first transistor, the second transistor, and the fifth transistor are NMOS-type and wherein the third transistor and the fourth transistor are PMOS-type.

9. The low-pass filter according to claim 3, wherein the first transistor, the second transistor, and the fifth transistor are NMOS-type and wherein the third transistor and the fourth transistor are PMOS-type.

10. The low-pass filter according to claim 5, wherein the first transistor, the second transistor, and the fifth transistor are NMOS-type and wherein the third transistor and the fourth transistor are PMOS-type.

11. The low-pass filter according to claim 6, wherein the first transistor, the second transistor, and the fifth transistor are NMOS-type and wherein the third transistor and the fourth transistor are PMOS-type.

12. A semiconductor product for frequency reception tuning, the semiconductor product comprising:

a transconductance differential amplifier stage mounted in an open loop including
  a first differential input and a second differential input, and
  a first differential output and a second differential output,
  with the first differential input and the second differential input having a given frequency range;

a low-pass filter for providing low-pass filtering of the differential amplifier stage, the low-pass filter with a cut-off frequency below the frequency range to be amplified, the low-pass filter including a passive circuit, including a capacitive element in parallel with a resistor, connected between the first differential output and the second differential output; and a control element for controlling a bias point of the differential amplifier stage so as to regulate a gain thereof.

13. The semiconductor product according to claim 12, wherein the differential amplifier stage further comprises:

a first transistor with a source, a gate, and a drain, wherein the gate of the first transistor receives a first portion of the differential input to be filtered;

a second transistor with a source, a gate, and a drain, wherein the gate of the second transistor receives a second portion of the differential input to be filtered;

a third transistor and a fourth transistor each with a source, a drain and a gate configured for selling the bias point of differential amplifier stage;

a fifth transistor with a source, a drain and a gate, and constituting a power source for the first transistor and the second transistor; and wherein a bias current of the third transistor, the fourth transistor and the fifth transistor are controlled by the control element.

14. The semiconductor product according to claim 13, wherein the passive circuit for providing the low-pass filtering is a first-order filter realized by at least the capacitive element and a drain-source resistance of one or more of the first transistor, the second transistor, the third transistor, and the fourth transistor.

15. The semiconductor product according to claim 14, wherein the capacitive element is one or more MOS-type transistors.

16. The semiconductor product according to claim 13, wherein the source of the first transistor and the source of the second transistor are connected to the drain of the fifth transistor;

wherein the source of the fifth transistor is connected to a first reference voltage;

wherein the drain of the first transistor is connected to the drain of the third transistor and the source of the third transistor is connected to a second reference voltage;

wherein the drain of the second transistor is connected to the drain of the fourth transistor and the source of the fourth transistor is connected to the second reference voltage; and wherein the gate of the third transistor, the fourth transistor, and the fifth transistor are controlled by the control element.

17. A semiconductor product comprising:

a first transistor with a source, a gate, and a drain, wherein the gate of the first transistor receives a first portion of a differential signal to be filtered and amplified;

a second transistor with a source, a gate, and a drain, wherein the gate of the second transistor receives a second portion of the differential signal;

a third transistor and a fourth transistor each with a source, a drain and a gate configured for setting a bias point of the first transistor and the second transistor;

a fifth transistor with a source, a drain and a gate, and constituting a power source for the first transistor and the second transistor;

a first differential output node connecting the drain of the first transistor and the drain of the third transistor, the first differential output node isolated from the gate of the first transistor;

a second differential output node connecting the drain of the second transistor and the fourth transistor, the second differential output node isolated from the gate of the second transistor;

a low-pass filter for providing low-pass filtering of the first transistor and the second transistor, the low-pass filter with a cut-off frequency below a frequency range to be amplified, the low-pass filter including a passive circuit, including a capacitive element in parallel with a resistor, connected between the first differential output node and the second differential output node; and a control element for controlling the bias point of the first transistor and the second transistor so as to regulate a gain thereof;

wherein the first transistor, the second transistor, the third transistor and the fourth transistor form a differential amplifier stage;

wherein a bias current of the third transistor, the fourth transistor and the fifth transistor are controlled by the control element.

18. The semiconductor product of according to claim 17, wherein the source of the first transistor and the source of the second transistor are connected to the drain of the fifth transistor;

wherein the source of the fifth transistor is connected to a first reference voltage;

wherein the drain of the first transistor is connected to the drain of the third transistor and the source of the third transistor is connected to a second reference voltage;

wherein the drain of the second transistor is connected to the drain of the fourth transistor and the source of the fourth transistor is connected to the second reference voltage; and wherein the gate of the third transistor, the fourth transistor, and the fifth transistor are controlled by the control element.

19. A low-pass differential filter with a variable gain, comprising:

a differential amplifier stage mounted in an open loop including a differential input and a differential output, with the differential input having a given frequency range and the differential output having a first output and a second output;

a passive circuit including a capacitive element in parallel with a resistor, connected between the first differential output and the second differential output, the passive circuit for providing low-pass filtering of the differential amplifier stage whose cut-off frequency is below the frequency range to be amplified; and a control element for controlling a bias point of the differential amplifier stage so as to regulate a gain thereof.

* * * * *